US010026886B2

(12) United States Patent
Moczygemba

(10) Patent No.: US 10,026,886 B2
(45) Date of Patent: Jul. 17, 2018

(54) SYSTEM FOR THERMOELECTRIC ENERGY GENERATION

(71) Applicant: MARLOW INDUSTRIES, INC., Dallas, TX (US)

(72) Inventor: Joshua E. Moczygemba, Wylie, TX (US)

(73) Assignee: Marlow Industries, Inc., Dallas, TX (US)

( * ) Notice: Subject to any disclaimer, the term of this patent is extended or adjusted under 35 U.S.C. 154(b) by 0 days.

(21) Appl. No.: 15/268,057

(22) Filed: Sep. 16, 2016

(65) Prior Publication Data
US 2017/0005252 A1 Jan. 5, 2017

Related U.S. Application Data

(63) Continuation of application No. 14/045,091, filed on Oct. 3, 2013, now Pat. No. 9,472,744.
(Continued)

(51) Int. Cl.
*H01L 35/32* (2006.01)
*H01L 35/34* (2006.01)
*H01L 35/30* (2006.01)

(52) U.S. Cl.
CPC .............. *H01L 35/32* (2013.01); *H01L 35/30* (2013.01); *H01L 35/34* (2013.01)

(58) Field of Classification Search
CPC .......... H01L 35/30; H01L 35/32; H01L 35/34
See application file for complete search history.

(56) References Cited

U.S. PATENT DOCUMENTS 3,304,207 A 2/1967 Kolb
4,149,025 A 4/1979 Niculescu
(Continued)

FOREIGN PATENT DOCUMENTS

| FR | 1361072 | 6/1964 |
| JP | 2006086210 | 3/2006 |
| WO | 03071198 | 8/2003 |

OTHER PUBLICATIONS

PCT, Notice of Transmittal of the International Search Report and the Written Opinon of the International Searching Authority, or the Declaration for International Application No. PCT/US2013/063352, dated Dec. 20, 2013.
(Continued)

*Primary Examiner* — Susan D Leong
(74) *Attorney, Agent, or Firm* — Baker Botts L.L.P.

(57) ABSTRACT

A system includes a first plate and a second plate. The first plate is arranged to be thermally coupled to a first surface and the second plate is arranged to be thermally coupled to an environment. The environment has a temperature that is different than the first surface. The system also includes a thermoelectric device that includes a plurality of thermoelectric elements. The thermoelectric device includes a third plate coupled to the plurality of thermoelectric elements and thermally coupled to the first plate. The thermoelectric device also includes a fourth plate coupled to the plurality of thermoelectric elements and thermally coupled to the second plate. The system also includes a dielectric fluid arranged between the first plate and the second plate. The thermoelectric elements are submersed in the dielectric fluid.

20 Claims, 8 Drawing Sheets

Related U.S. Application Data

(60) Provisional application No. 61/745,413, filed on Dec. 21, 2012, provisional application No. 61/709,895, filed on Oct. 4, 2012.

(56) References Cited

U.S. PATENT DOCUMENTS

| | | |
|---|---|---|
| 5,002,336 A | 3/1991 | Feher |
| 5,430,322 A | 7/1995 | Koyanagi et al. |
| 6,509,520 B1 | 1/2003 | Kyle et al. |
| 2002/0148235 A1 | 10/2002 | Bell |
| 2004/0094194 A1 | 5/2004 | Aldoretta et al. |
| 2006/0005873 A1* | 1/2006 | Kambe .................. H01L 35/30 136/211 |
| 2010/0119770 A1 | 5/2010 | Hiroyama et al. |
| 2012/0160186 A1* | 6/2012 | Turrin .................... F23N 1/005 122/14.21 |

OTHER PUBLICATIONS

USPTO Non-Final Office Action for U.S. Appl. No. 014/045,091, filed Oct. 3, 2013, Notification Date: Feb. 25, 2016.
Response Pursuant to 37 C.F.R. 1.111, U.S. Appl. No. 14/045,091, date filed Oct. 3, 2013, filed May 25, 2016.
JP2006086210A, Hino et al., English equivalent of the abstract to Japanese foreign reference listed above, dated Mar. 30, 2006.

* cited by examiner

SYSTEM FOR THERMOELECTRIC ENERGY GENERATION

RELATED APPLICATION

This application is a continuation of U.S. application Ser. No. 14/045,091 filed Oct. 3, 2013 and entitled "A System for Thermoelectric Energy Generation," which claims benefit under 35 U.S.C. § 119(e) of U.S. Provisional Application Ser. No. 61/709,895, titled "A System For Thermoelectric Energy Generation," filed Oct. 4, 2012, by Joshua E. Moczygemba and U.S. Provisional Application Ser. No. 61/745,413, titled "A System For Thermoelectric Energy Generation," filed Dec. 21, 2012, by Joshua E. Moczygemba.

TECHNICAL FIELD

This disclosure relates to generally to energy generation and more particularly to a system for thermoelectric energy generation.

BACKGROUND

The basic theory and operation of thermoelectric devices has been developed for many years. Presently available thermoelectric devices used for cooling typically include an array of thermocouples that operate in accordance with the Peltier effect. Thermoelectric devices may also be used for heating, power generation, and temperature sensing.

A thermoelectric device produces electrical power from heat flow across a temperature gradient. As the heat flows from hot to cold, free charge carriers in the thermoelectric material are also driven to the cold end. The resulting voltage is proportional to the temperature difference via the Seebeck coefficient.

SUMMARY

In one embodiment, a system includes a first plate and a second plate. The first plate is arranged to be thermally coupled to a first surface and the second plate is arranged to be thermally coupled to an environment. The environment has a temperature that is different than the first surface. The system also includes a thermoelectric device that includes a plurality of thermoelectric elements. The thermoelectric device includes a third plate coupled to the plurality of thermoelectric elements and thermally coupled to the first plate. The thermoelectric device also includes a fourth plate coupled to the plurality of thermoelectric elements and thermally coupled to the second plate. The system also includes a dielectric fluid arranged between the first plate and the second plate. The thermoelectric elements are submersed in the dielectric fluid.

In some embodiments, a gasket may be situated within a groove of the first plate. The system may include a wall situated between the first plate and the second plate. The wall may be situated around the thermoelectric device. The wall may include thermally insulative material.

In one embodiment, a method includes thermally coupling a first plate to a first surface and thermally coupling a second plate to an environment. The environment has a temperature that is different than the first surface. The method further includes generating electricity using a thermoelectric device based on a temperature gradient between the first plate and the second plate. The thermoelectric device includes a plurality of thermoelectric elements submersed in a dielectric fluid. The thermoelectric device also includes a third plate coupled to the plurality of thermoelectric elements and thermally coupled to the first plate as well as a fourth plate coupled to the plurality of thermoelectric elements and thermally coupled to the second plate.

BRIEF DESCRIPTION OF THE DRAWINGS

Reference is now made to the following description taken in conjunction with the accompanying drawings, wherein like reference numbers represent like parts.

DETAILED DESCRIPTION

Figure 1A:
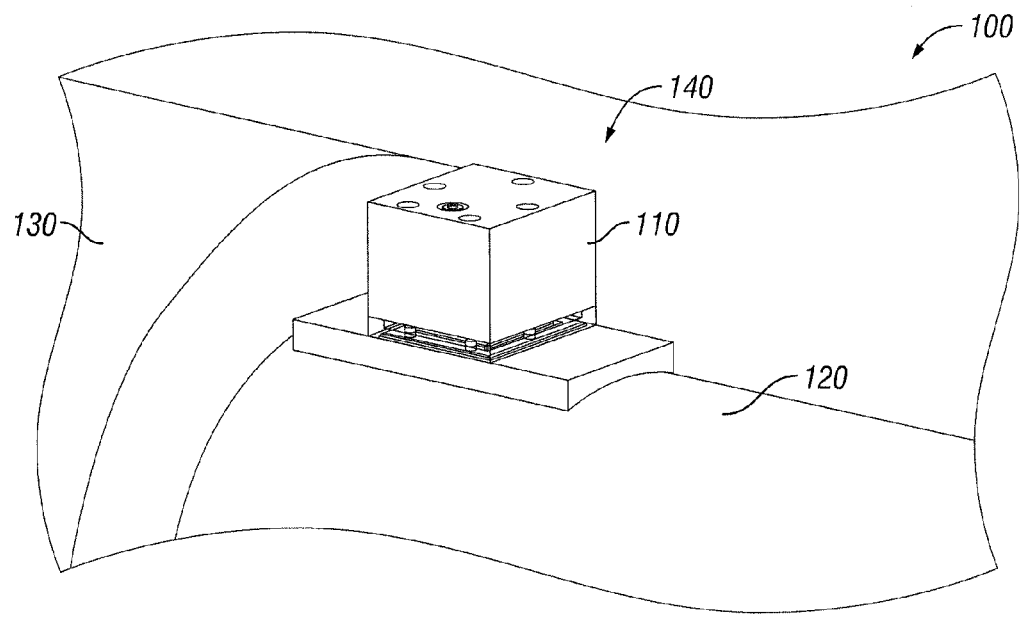
FIGS. 1A and 1B illustrate one embodiment of a system that is configured to generate electrical energy.
Figure 1B:
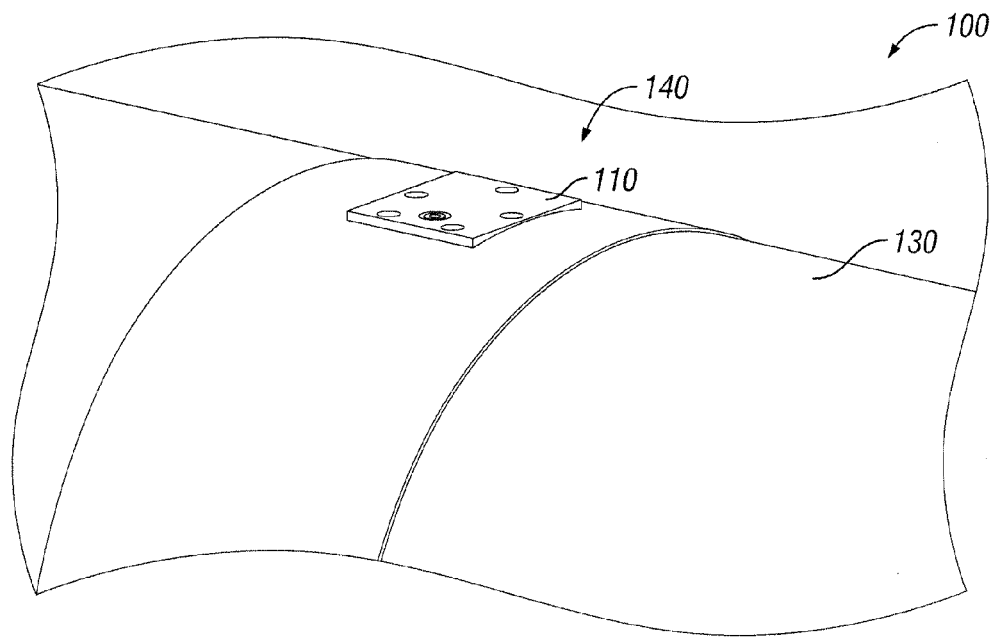

FIGS. 1A and 1B illustrate one embodiment of system 100 that is configured to generate electrical energy. In some embodiments, pipe 120 is in a high pressure (e.g., 100-10,000 psi) environment 140 (e.g., deep sea water, such as 10,000 feet below sea level at approximately 40 degrees Fahrenheit) and contains a hot (e.g., between 100 and 300 degrees Fahrenheit) medium (e.g., liquid or gas). As such, there is a temperature gradient between pipe 120 and environment 140 (e.g., a gradient between 50 and 200 degrees Fahrenheit). Thermoelectric generator 110 is situated such that one side of generator 110 is thermally coupled to pipe 120 (e.g., by being secured directly to pipe 120 or with suitable thermal interface materials such as graphite pads, grafoil, or other thermal pads situated between pipe 120 and generator 110) while another side of generator 110 is exposed to environment 140. Thermoelectric generator 110 is situated inside insulation 130 that covers pipe 120 such that a side of generator 110 is still exposed to environment 140 (as depicted in FIG. 1B). Thermoelectric generator 110 is configured to generate electricity based on the temperature difference between pipe 120 and environment 140 using the Seebeck effect. In some embodiments, generator 110 may be a reliable source of electrical energy suitable to power electronics such as sensors due to the near constant temperature difference between pipe 120 and environment 140. In some embodiments, pipe 120 may contain a cold medium and environment 140 may be hot; thermoelectric generator 110 may provide electrical energy in this situation due to the temperature difference between pipe 120 and environment 140.

In some embodiments, high pressure environment 140 may include environments such as deep sea water. Another, example of environment 140 is the interior of a pressure vessel. Yet another example of environment 140 is the interior of a pipeline. Thus, while the present disclosure discusses deep sea water as an example environment, the disclosure is applicable in other environments, such as those that have higher than normal pressure and those that lead to temperature gradients between the environment and devices in the environment.

In some embodiments, system 100 may be a continuous power source designed to harvest thermal energy (e.g., from subsea pipelines). The large temperature gradients between the pipelines and water may facilitate sustained, long term thermal energy harvesting. An example utility of this is avoiding battery replacement which may not be an economical option in such an environment. Example advantages of embodiments of system 100 are that system 100 may provide perpetual or continual, no maintenance power for subsea or deep sea applications. As another example, system 100 can be used to implement a sustainable, low-cost solution to monitoring ocean floor pipelines. Typically, ocean floor pipelines are costly to monitor and repair, especially after they have been substantially damaged. Using system 100, problems may be detected beforehand and costly repairs can be avoided. For example, electrical energy produced by system 100 can then be used to power low-power electronics that can be used to monitor a pipeline in a convenient package which can be attached to the pipeline during a field jointing process.

Figure 2:
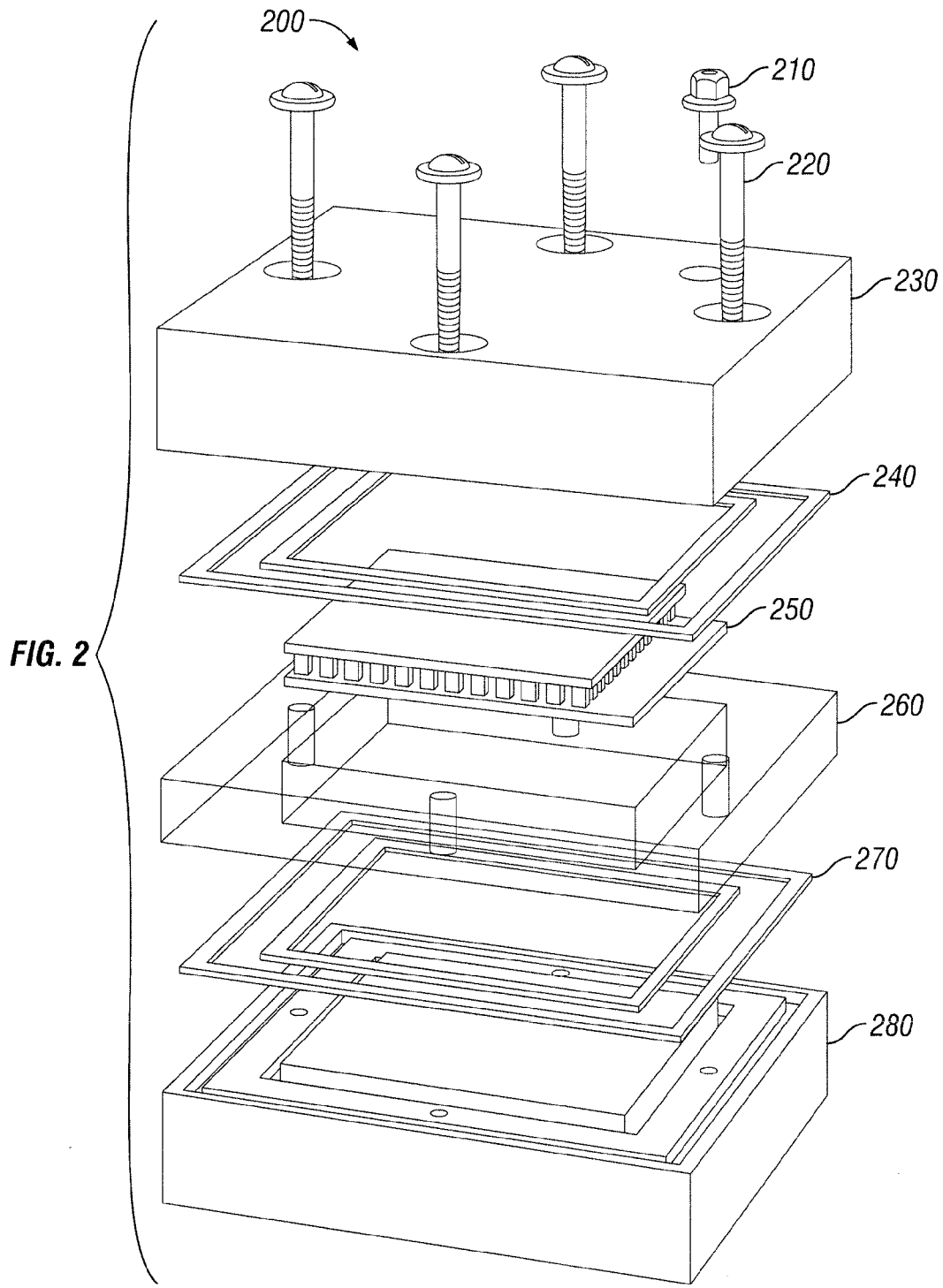
FIG. 2 is an exploded view of one embodiment of a thermoelectric generator.

FIG. 2 is an exploded view of one embodiment of thermoelectric generator 200 that may be used to implement thermoelectric generator 110 of FIGS. 1A and 1B. Cold side plate 230 is fastened to hot side plate 280 using fasteners 220 (e.g., nails, screws, and/or rivets). Thermoelectric device 250 is situated between plates 230 and 280 such that one side of thermoelectric device 250 is thermally coupled to plate 230 while another side of thermoelectric device 250 is thermally coupled to plate 280. Immediately surrounding thermoelectric device 250 is wall 260. Plates 230 and 280 as well as wall 260 may have grooves that are configured to receive gaskets 240 and 270. Plate 230 may also include an orifice that allows for fluid to be poured into generator 200 once it is assembled and that orifice may be sealed using plug 210.

In some embodiments, plates 230 and 280 can be titanium, stainless steel, aluminum, 90Cu10Ni alloy, or any bare or coated metal. In some embodiments, plates 230 and 280 may provide long term protection against sea water. In some embodiments, exterior sided edge insulation (such as insulation 130) may be placed around the side edges of the housing (e.g., around plates 230 and 280) to further insulate thermoelectric generator 200 from thermal shorting (e.g., due to sea water in applicable circumstances).

In some embodiments, gaskets 240 and 270 may be hydraulic gaskets. Materials such as viton, nitrile, hydrogenated nitrile, fluorsilicone, epdm, silicone may be employed to form gaskets 240 and 270. Gaskets 240 and 270 may prevent mixing of hydraulic fluid and sea water.

In some embodiments, wall 260 may be a low conductivity wall. For example, thermally insulative materials (e.g. polysulfone, Teflon, polycarbonate, nitrile, acrylic) may be used to form wall 260. This may reduce, minimize, or prevent thermal shorting from the hot side to the cold side of thermoelectric generator 200. This can be used to help force heat through thermoelectric device 250.

In some embodiments, thermoelectric generator 200 may produce electrical energy when a temperature difference exists between plates 230 and 280. Gaskets 240 and 270 may allow generator 200 to operate in aquatic environments such as deep sea water. Wall 260 may allow generator 200 to operate in the presence of high pressure such as those encountered in deep sea water. An example advantage is that gaskets 240 and 270 as well as low pressure differences between the inside of thermoelectric generator 200 and its environment may allow for using materials with low thermal conductivity to reduce or minimize reduction in performance due to thermal shorting. Another example advantage is that thermal shorting effects through housing of thermoelectric generator 200 may be reduced. For example, materials used for plates 230 and 280 as well as wall 260 can be chosen to avoid thermal shorting. As another example, thermal shorting can be avoided by allowing for plates 230 and 280 to have different shapes and thicknesses than what is typically used in high pressure environments.

In some embodiments, a configuration of thermoelectric generator 200 may eliminate wall 260 as well as gaskets 240 and 270 and replace them with a single hydraulic gasket. The size, shape and material of this single hydraulic gasket could be tailored to minimize conduction between plates 230 and 280. One or more thin layers of dielectric hydraulic fluid (e.g., mineral oil, silicone oil, or vegetable oil) may serve as thermal interfaces between thermoelectric device 250 and plates 230 and 280. In some embodiments, graphite pads, grafoil, or other thermal pads may serve as thermal interfaces between thermoelectric device 250 and plates 230 and 280. Dielectric hydraulic fluids may be used in combination with thermal pads as thermal interfaces between thermoelectric device 250 and plates 230 and 280.

Figure 3:
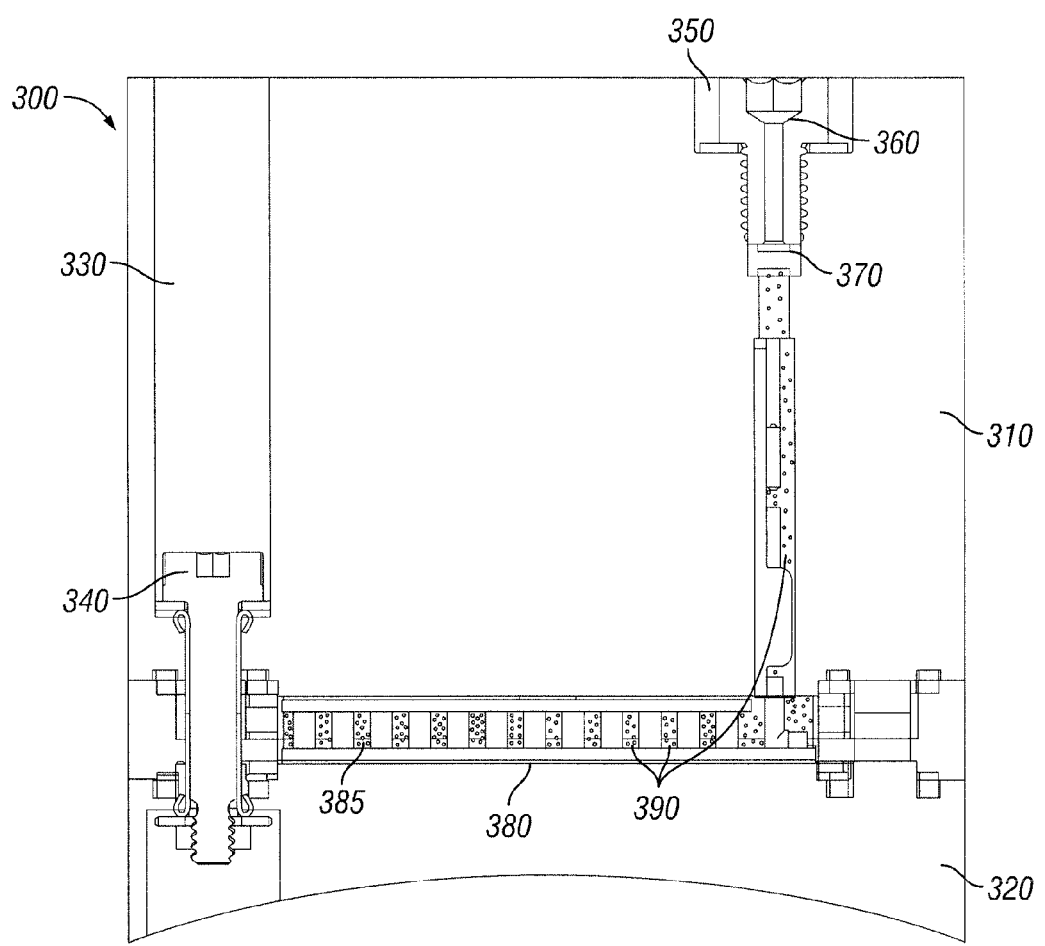
FIG. 3 is a side view of one embodiment of a thermoelectric generator including a diaphragm.

FIG. 3 is a side view of one embodiment of thermoelectric generator 300. Thermoelectric generator ("TEG") 300 may be used to implement thermoelectric generator 200 of FIG. 2 and thermoelectric generator 110 of FIGS. 1A and 1B. Cold side plate 310 is fastened to hot side plate 320 using fastener 340 through channel 330. Thermoelectric device 380 is situated between plates 310 and 320 such that one side of thermoelectric device 380 is thermally coupled to plate 310 and another side of thermoelectric device 380 is thermally coupled to plate 320. Orifice 350 provides a manner in which to introduce substances into thermoelectric generator 300 such as fluid 390. Orifice 350 is sealed using plug 360. Diaphragm 370 may interface with plug 360. Some or all of the spaces between and/or around thermoelectric elements of thermoelectric device 380 may include baffles 385 (e.g., open cell hexagonal strips). In some embodiments, thermoelectric generator 300 can handle very large isostatic pressures. Testing has shown that 10,000 psi under isostatic conditions poses no significant change to performance of thermoelectric device 380.

In some embodiments, diaphragm 370 can allow for pressure equalization in the event air is trapped in the interior portion of the block. One mechanism by which this could occur with thermoelectric modules is the collapsing of air pockets entrained in solder joints as isostatic pressure increases. In such a case, diaphragm 370 would be sized so as to compensate for the change in internal volume of housing in TEG 300. Diaphragm 370 would then displace, rather than housing of TEG 300 needing to support, the pressure differential.

In some embodiments, fluid 390 may be a low thermal conductivity, dielectric, incompressible fluid. In some embodiments, a fluid counteracts the external pressure of the seawater at large depths (reducing the need for thick walls for housing of TEG 300) and evenly distributes the pressure to every surface of the TEG module. For example, a hollow egg crushes quickly at low depth, but the same egg completely filled with an incompressible fluid could be submerged to large depths (e.g., the bottom of the Marianas Trench) without rupture. Also, since fluid 390 has a low thermal conductivity, transfer of heat from hot pipe to cold plate through the fluid is minimized. In some embodiments, the need for thick housing walls and strong materials is also reduced, significantly reducing thermal bypass through these walls (around TEG 300) from hot to cold side. In some embodiments, such a design significantly increases power output of TEG 300 (because the excess heat does not saturate the cold plate). Fluid 390 may be a hydraulic fluid (e.g., k=0.13 W/m·K), such as mineral oil, silicone oil, or vegetable oil to minimize thermal conduction losses through fluid 390 from hot to cold reservoirs. In some embodiments, liquid 390 may include a low thermal conductivity, non-compressible filler (e.g., a powder that is incompressible and not electrically conductive such as aluminum oxide, silicate, or ceramic type powders) or other suitable alternatives. The filler can be used to prevent convection currents. Also, a thin layer of fluid 390 can serve to aid or replace thermal interface material between thermoelectric device 380 and plates 310 and 320 thereby reducing the thermal interface contact resistance.

In some embodiments, thermoelectric generator 300 includes aspects that may facilitate generation of electric energy in high pressure environments such as deep sea water based on temperature differences between plates 310 and 320. For example, dielectric fluid 390 may be used to alleviate differential pressures. As another example, baffles 385 and/or filler material may be used to suppress convection currents.

Figure 4:
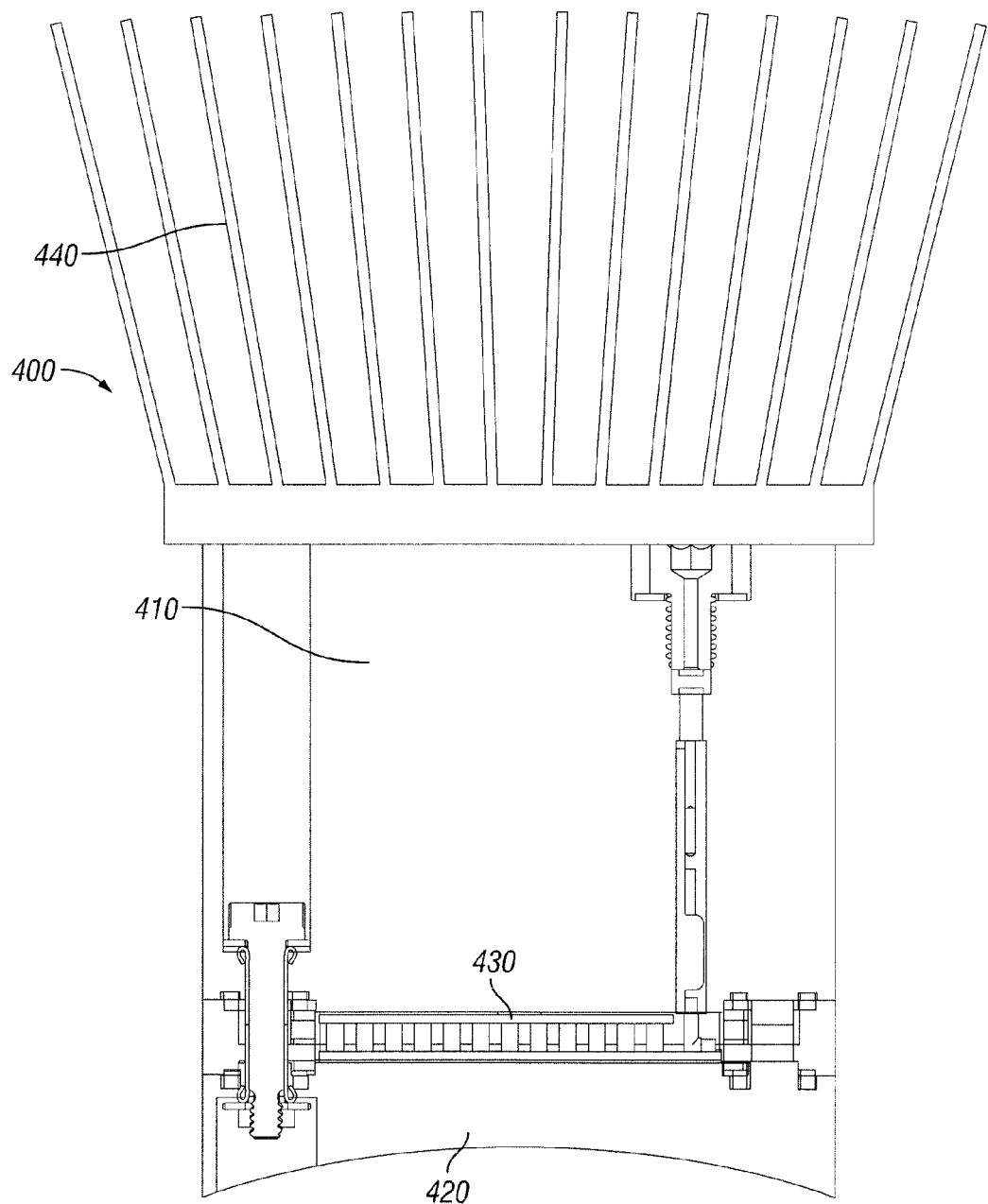
FIG. 4 is a side view of one embodiment of a thermoelectric generator that incorporates a fin.

FIG. 4 is a side view of one embodiment of thermoelectric generator ("TEG") 400 that incorporates fin 440. Thermoelectric generator 400 may be used to implement thermoelectric generator 200 of FIG. 2 and thermoelectric generator 110 of FIGS. 1A and 1B. Cold side plate 410 and hot side plate 420 are each thermally coupled to different sides of thermoelectric device 430. Fin 440 is situated on cold side plate 410 and may assist in heat transfer to the environment in which thermoelectric generator 400 is situated (e.g., deep sea water).

In some embodiments, fin 440 may be any fixture capable of increasing the surface area over which TEG 400 may exchange thermal energy with its environment. For example, fin 440 may be a zipped or stacked fin heat exchanger comprising a plurality of closely-spaced fins separated from one another by a series of spaces. Each fin may include one or more flanges or other features operable to interlock the plurality of fins together into a single, unitary array. For example, flanges may be a series of frusto-conically-shaped perforations in fin 440 that are nested inside one another to link each of the individual fins together. Fin 440 may include a plurality of zipped fin structures, with each having a flat bottom coupled to a plurality of parallel fins. Fin 440 may be implemented using extrusion or skiving processes. Fin 440 may be a folded fin structure comprising a single sheet of material that has been consecutively folded over onto itself to create a single array of closely spaced fins. Fin 440 may include a lateral (e.g., generally L-shaped) fold at one end that, when aggregated together, form a flat.

Figure 5:
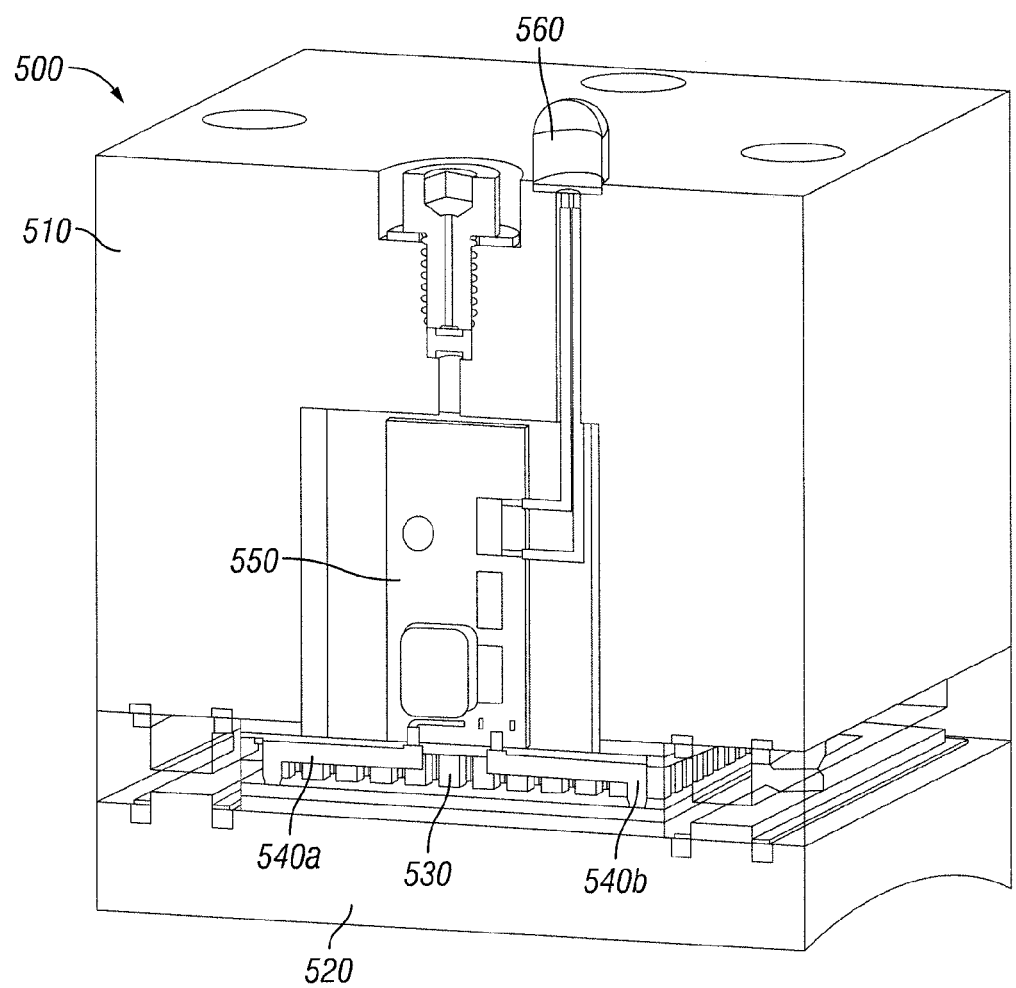
FIG. 5 is a side view of one embodiment of a thermoelectric generator that incorporates an electronic device.

FIG. 5 is a side view of one embodiment of thermoelectric generator 500 that incorporates an electronic device. Cold side plate 510 and hot side plate 520 are each thermally coupled to different sides of thermoelectric device 530. Electrical energy is generated by thermoelectric device 530 as a result of temperature differences between plates 510 and 520 and can be directed to electronic component 550 via leads 540a-b. Electronic component 550 is situated within cold side plate 510. Examples of electronic component 550 include circuit boards, power storage, sensors, and transmitters.

Figure 6:
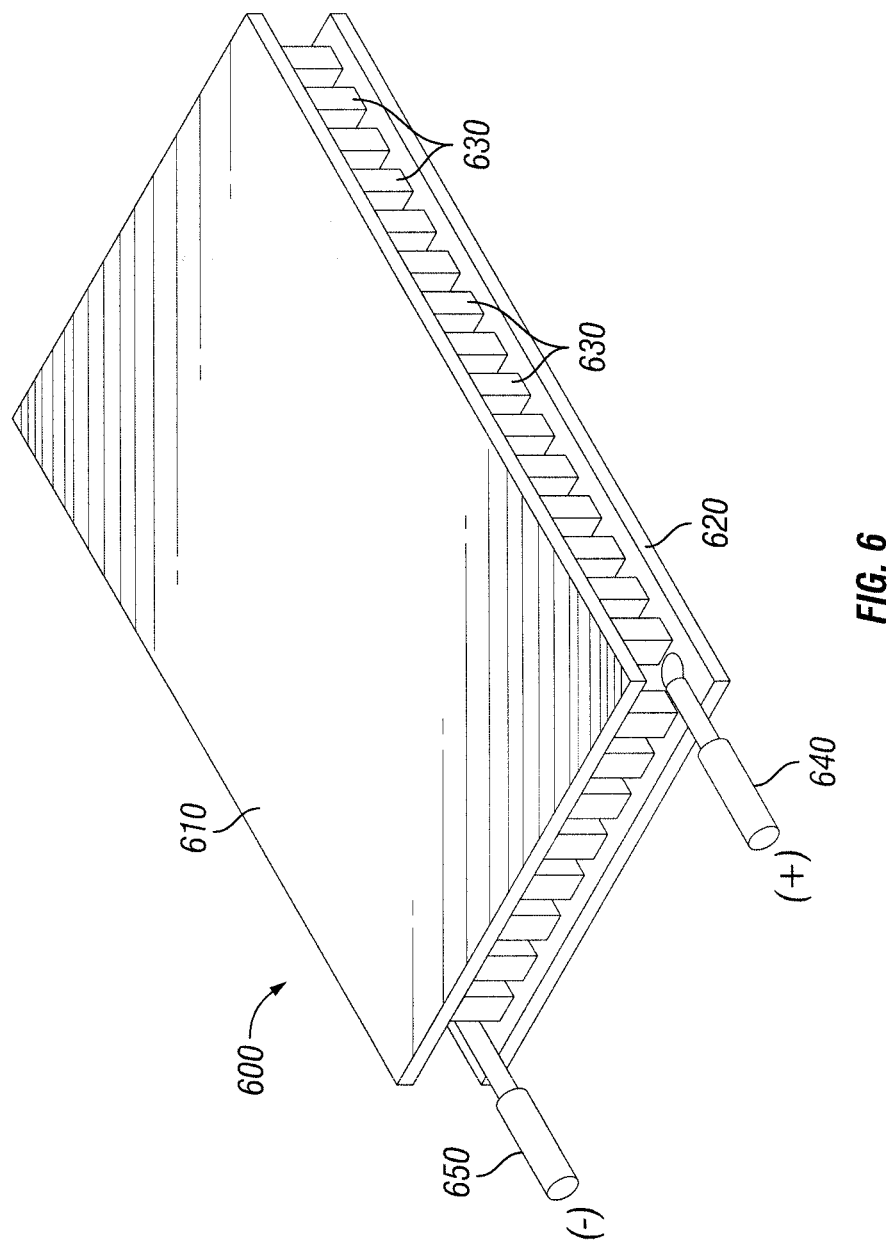
FIG. 6 illustrates one embodiment of a thermoelectric device.

FIG. 6 illustrates one embodiment of thermoelectric device 600 that may be used to implement thermoelectric device 250 of FIG. 2, thermoelectric device 380 of FIG. 3, thermoelectric device 430 of FIG. 4, and thermoelectric device 530 of FIG. 5. Thermoelectric device 600 includes a plurality of thermoelectric elements 630 disposed between plates 610 and 620. Electrical terminals 640 and 650 are provided to allow thermoelectric device 600 to be electrically coupled with to one or more devices that use, transform, or store electrical power.

In some embodiments, thermoelectric elements 630 fabricated from dissimilar semiconductor materials such as N-type thermoelectric elements and P-type thermoelectric elements. Thermoelectric elements 630 are typically configured in a generally alternating N-type element to P-type element arrangement and typically include an air gap disposed between adjacent N-type and P-type elements. In many thermoelectric devices, thermoelectric materials with dissimilar characteristics are connected electrically in series and thermally in parallel.

Examples of thermoelectric devices and methods of fabrication are shown in U.S. Pat. No. 5,064,476 titled Thermoelectric Cooler and Fabrication Method; U.S. Pat. No. 5,171,372 titled Thermoelectric Cooler and Fabrication Method; and U.S. Pat. No. 5,576,512 titled Thermoelectric Apparatus for Use With Multiple Power Sources and Method of Operation.

N-type semiconductor materials generally have more electrons than would be found in the associated ideal crystal lattice structure. P-type semiconductor materials generally have fewer electrons than would be found in the associated ideal crystal lattice structure. The "missing electrons" are sometimes referred to as "holes." The extra electrons and extra holes are sometimes referred to as "carriers." The extra electrons in N-type semiconductor materials and the extra holes in P-type semiconductor materials are the agents or carriers that transport or move heat energy between plates 510 and 620 through thermoelectric elements 630 when subject to a DC voltage potential. These same agents or carriers may generate electrical power when an appropriate temperature difference is present between plates 610 and 620. Terminals 640 and 650 may be coupled to one of plates 610 and 620 in a manner that withstands high temperature environments, such as resistance welding, tungsten inert gas (TIG) welding, and laser welding.

In some embodiments, thermoelectric elements 630 may include high temperature thermoelectric material. Examples of high temperature thermoelectric materials include lead telluride (PbTe), lead germanium telluride (PbxGe1-xTe), TAGS alloys (such as (GeTe)0.85(AgSbTe2)0.15), bismuth telluride (Bi2Te3) based alloys, and skutterudites.

In some embodiments, thermoelectric elements 630 may include a diffusion barrier that includes refractory metals (e.g., a metal with a melting point above 1,850° C.). Suitable refractory metals may include those that are metallurgically compatible with high temperature thermoelectric materials and metallurgically compatible with other components of thermoelectric device 600. For example, a molybdenum diffusion barrier may be used. This may be advantageous in that molybdenum may be metallurgically compatible with various aspects of thermoelectric device 600. For example, as further discussed below, thermoelectric device 600 may include an aluminum braze that is metallurgically compatible with a molybdenum diffusion barrier. Such a diffusion barrier may prevent or reduce the chance or occurrence of Kirkendall voiding in thermoelectric device 600. Other suitable examples of diffusion barrier materials that could have similar properties to molybdenum include tungsten and titanium.

In some embodiments, alternating thermoelectric elements 630 of N-type and P-type semiconductor materials may have their ends connected by electrical conductors. Conductors may be metallizations formed on thermoelectric elements 630 and/or on the interior surfaces of plates 610 and 620. Conductors may include aluminum. Ceramic materials may be included in plates 610 and 620 which define in part the cold side and hot side, respectively, of thermoelectric device 600. In some embodiments, the ceramic materials may provide electrical isolation from hot and cold side sources. Aluminum metallized ceramics may accommodate thermal stresses (i.e., due to high temperature exposure) of the ceramic/aluminum bond. Examples of suitable ceramic materials include anodized aluminum, aluminum oxide, aluminum nitride, and beryllium oxide.

In some embodiments, thermoelectric elements 630 may be coupled to plates 610 and 620 using a medium. The medium may include brazes and/or solders. For example, aluminum-based brazes and/or solders may be used, such as aluminum-silicon (Al—Si) braze family and/or zinc-aluminum (Zn—Al) solder. In some embodiments, using such brazes and/or solders may provide for high temperature operation and allow for flexible joints. Kirkendall voiding may be prevented or reduced.

Figure 7A:
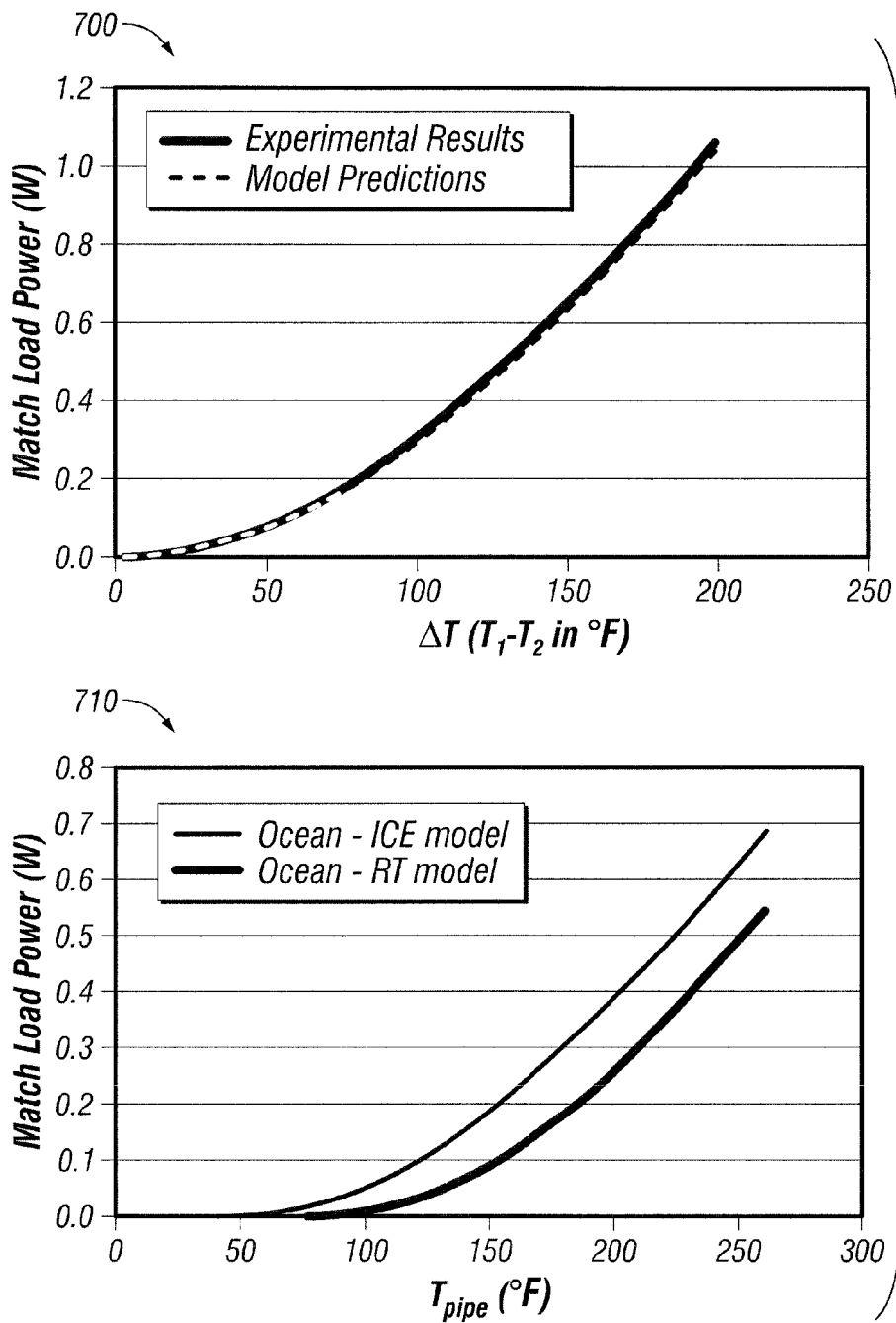
FIGS. 7A and 7B are a set of charts depicting examples of performance characteristics of embodiments of thermoelectric generators.
Figure 7B:
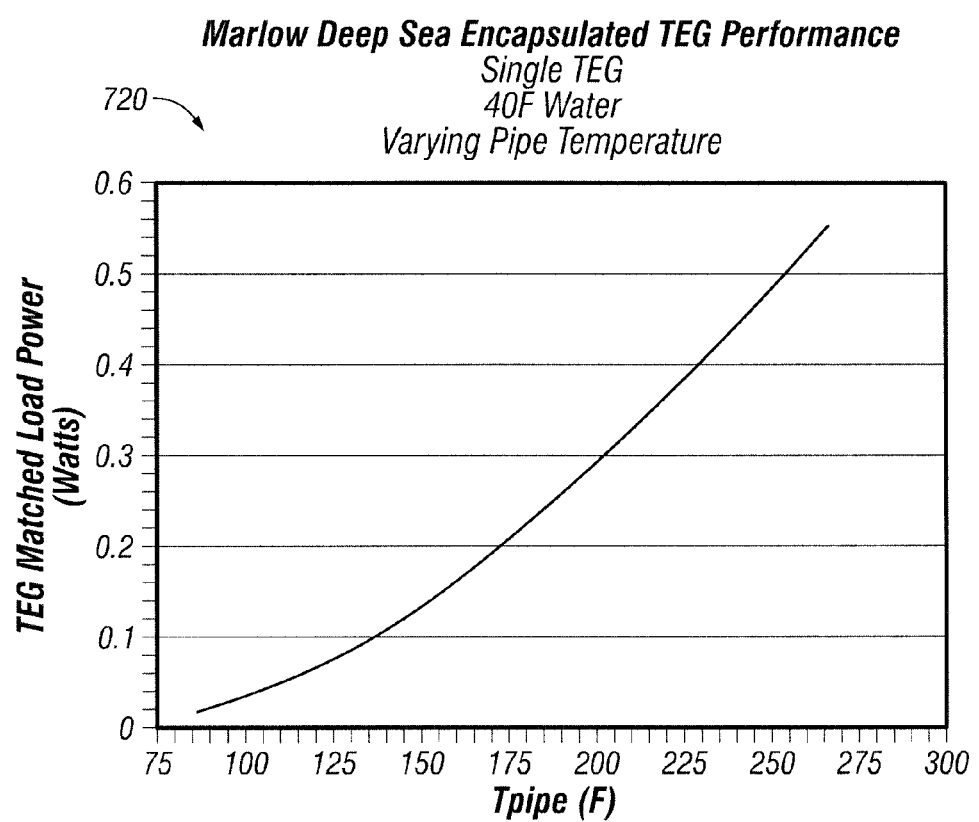

FIGS. 7A and 7B are a set of charts depicting examples of performance characteristics (based on models and experiments) of embodiments of thermoelectric generators configured as described above with respect to FIGS. 1A-6. Chart 700 depicts power output (both of a model and experimental results) of a thermoelectric generator, such as thermoelectric generator 110 of FIG. 1A, as a result of the amount of temperature difference present (e.g., the difference in temperature between pipe 120 and environment 140 of FIG. 1A). The following table provides examples of the values used in chart 700:

| Difference | | |
|---|---|---|
| Temperature (F.) | Power (Watts) | Model (Watts) |
| 200.192 | 1.067 | 1.050 |
| 200.176 | 1.066 | 1.050 |
| 158.731 | 0.707 | 0.691 |
| 157.284 | 0.696 | 0.679 |
| 128.209 | 0.474 | 0.465 |
| 94.964 | 0.268 | 0.262 |
| 73.661 | 0.164 | 0.160 |
| 54.983 | 0.093 | 0.090 |
| 45.232 | 0.063 | 0.061 |
| 44.779 | 0.062 | 0.060 |
| 32.362 | 0.033 | 0.032 |
| 32.011 | 0.032 | 0.031 |
| 25.349 | 0.020 | 0.019 |
| 25.103 | 0.020 | 0.019 |
| 21.568 | 0.015 | 0.014 |
| 21.353 | 0.014 | 0.014 |
| 17.838 | 0.010 | 0.010 |
| 13.450 | 0.006 | 0.006 |
| 10.690 | 0.004 | 0.003 |
| 7.576 | 0.002 | 0.002 |
| 5.546 | 0.001 | 0.001 |
| 3.719 | 0.001 | 0.000 |
| 2.878 | 0.000 | 0.000 |

Charts 710 and 720 indicate power outputs of a thermoelectric generator, such as thermoelectric generator 110 of FIG. 1A, as compared to the temperature of a pipe (e.g., pipe 120 of FIG. 1A) to which the thermoelectric generator is attached. Chart 710 is the result of experiments where ice water ("ICE"), at 4.44 degrees Celsius, is used and where room temperature ("RT") water, at 25 degrees Celsius, is used. The following tables provide examples of the values used in chart 710:

| Ice | |
|---|---|
| Pipe Temperature (F.) | Power (Watts) |
| 42.8 | 0.0 |
| 49.6 | 0.001 |
| 67.1 | 0.009 |
| 80.6 | 0.021 |
| 98.6 | 0.047 |
| 103.6 | 0.057 |
| 108.5 | 0.067 |
| 120.2 | 0.095 |
| 131.0 | 0.125 |
| 152.6 | 0.196 |
| 162.5 | 0.233 |
| 176.5 | 0.288 |
| 196.3 | 0.371 |
| 210.7 | 0.435 |
| 225.5 | 0.505 |
| 260.2 | 0.681 |

| Room Temperature | |
|---|---|
| Pipe Temperature (F.) | Power (Watts) |
| 42.8 | 0.000 |
| 49.6 | 0.000 |
| 67.1 | 0.000 |
| 80.6 | 0.000 |
| 98.6 | 0.008 |
| 103.6 | 0.012 |
| 108.5 | 0.016 |
| 120.2 | .095 |
| 131.0 | 0.049 |
| 152.6 | 0.097 |
| 162.5 | 0.125 |
| 176.5 | 0.170 |
| 196.3 | 0.244 |
| 210.7 | 0.304 |
| 225.5 | 0.372 |
| 260.2 | 0.543 |

Chart 720 is the result of experiments where water at 40 degrees Fahrenheit is used. The following table provides examples of the values used in chart 720:

| Pipe Temperature (F.) | Power (Watts) |
|---|---|
| 266 | 0.551 |
| 230 | 0.403 |
| 194 | 0.272 |
| 158 | 0.157 |
| 122 | 0.071 |
| 86 | 0.018 |

Depending on the specific features implemented, particular embodiments may exhibit some, none, or all of the following technical advantages. By enabling deep sea operation, TEG energy harvesting may be a solution for deep water monitoring of oil pipe lines. A housing for a thermoelectric generator that can withstand significant amount of pressure yet also allow heat to be transferred through a thermoelectric device has been described. Other technical advantages will be readily apparent to one skilled in the art from the preceding figures and description as well as the proceeding claims and appendices. Particular embodiments may provide or include all the advantages disclosed, particular embodiments may provide or include only some of the advantages disclosed, and particular embodiments may provide none of the advantages disclosed.

Although several embodiments have been illustrated and described in detail, it will be recognized that modifications and substitutions are possible.

What is claimed is:

1. A system comprising:
   a first plate, the first plate arranged to be thermally coupled to a first surface;
   a second plate, the second plate arranged to be thermally coupled to an environment, the environment comprising a temperature that is different than the first surface;
   a thermoelectric device, comprising:
      a plurality of thermoelectric elements;
      a third plate coupled to the plurality of thermoelectric elements and thermally coupled to the first plate;
      a fourth plate coupled to the plurality of thermoelectric elements and thermally coupled to the second plate;
   dielectric hydraulic fluid arranged between the first plate and the second plate, the thermoelectric elements submersed in the dielectric hydraulic fluid;
   an orifice in the second plate, the orifice arranged to introduce the dielectric hydraulic fluid to the thermoelectric elements; and
   a diaphragm coupled to the orifice, the diaphragm arranged to displace a pressure differential when air is trapped between the first plate and the second plate.

2. The system of claim 1, further comprising a first gasket situated within a groove of the first plate and a second gasket situated within a groove of the second plate.

3. The system of claim 1, further comprising a wall situated between the first plate and the second plate, the wall situated around the thermoelectric device, the wall comprising thermally insulative material.

4. The system of claim 1, further comprising a plurality of baffles situated in a plurality of spaces between thermoelectric elements of the plurality of thermoelectric elements.

5. The system of claim 1, wherein the second plate comprises a cavity configured to house an electronic component.

6. The system of claim 1, further comprising a fin situated on the second plate.

7. The system of claim 1, wherein the diaphragm is situated in the second plate.

8. The system of claim 1, wherein:
   the first surface is a surface of a pipe; and
   the environment is a sea water environment having over 20 psi of pressure.

9. A method comprising:
   thermally coupling a first plate to a first surface;
   thermally coupling a second plate to an environment, the environment comprising a temperature that is different than the first surface;
   generating electricity using a thermoelectric device based on a temperature gradient between the first plate and the second plate, the thermoelectric device comprising:
      a plurality of thermoelectric elements submersed in a dielectric hydraulic fluid;
      a third plate coupled to the plurality of thermoelectric elements and thermally coupled to the first plate; and
      a fourth plate coupled to the plurality of thermoelectric elements and thermally coupled to the second plate; and
   wherein the second plate comprises an orifice, the orifice arranged to introduce the dielectric hydraulic fluid to the thermoelectric elements; and
   coupling a diaphragm to the orifice, the diaphragm arranged to displace a pressure differential when air is trapped between the first plate and the second plate.

10. The method of claim 9, wherein:
    the first plate comprises a first gasket; and
    the second plate comprises a second gasket.

11. The method of claim 9, wherein a wall comprising thermally insulative material is situated between the first plate and the second plate, the wall situated around the thermoelectric device.

12. The method of claim 9, wherein a plurality of spaces between thermoelectric elements of the plurality of thermoelectric elements comprise a plurality of baffles.

13. The method of claim 9, further comprising providing electrical power to an electronic component housed in a cavity of the second plate.

14. The method of claim 9, wherein a fin is situated on the second plate.

15. The method of claim 9, wherein the diaphragm is situated in the second plate.

16. The method of claim 9, wherein:
    the first surface is a surface of a pipe; and
    the environment is a sea water environment having over 20 psi of pressure.

17. A system comprising:
    a first plate, the first plate arranged to be thermally coupled to a pipe;
    a second plate, the second plate arranged to be thermally coupled to a sea water environment having over 20 psi of pressure, the temperature of the sea water environment being over 10 degrees Fahrenheit different than the first surface;
    a thermoelectric device, comprising:
       a plurality of thermoelectric elements;
       a third plate coupled to the plurality of thermoelectric elements and thermally coupled to the first plate;
       a fourth plate coupled to the plurality of thermoelectric elements and thermally coupled to the second plate;
    dielectric hydraulic fluid arranged between the first plate and the second plate, the thermoelectric elements submersed in the dielectric hydraulic fluid,
    an orifice in the second plate, the orifice arranged to introduce the dielectric hydraulic fluid to the thermoelectric elements;
    a diaphragm coupled to the orifice, the diaphragm arranged to displace a pressure differential when air is trapped between the first plate and the second plate; and
    a wall situated between the first plate and the second plate, the wall situated around the thermoelectric device, the wall comprising thermally insulative material.

18. The system of claim 17, further comprising insulation coupled to the first plate and the second plate.

19. The system of claim 1, further comprising insulation coupled to the first plate and the second plate.

20. The method of claim 9, further comprising coupling insulation to the first plate and the second plate.

* * * * *